United States Patent
Ng et al.

(10) Patent No.: US 8,852,746 B2
(45) Date of Patent: Oct. 7, 2014

(54) SUBSTRATE COATING AND METHOD OF FORMING THE SAME

(75) Inventors: Kit Ling Ng, Hong Kong (HK); Xin Chao Duan, Hong Kong (HK); Po Ching Chan, Hong Kong (HK); Winston Chan, Hong Kong (HK)

(73) Assignee: Winsky Technology Limited, Hong Kong (HK)

( * ) Notice: Subject to any disclaimer, the term of this patent is extended or adjusted under 35 U.S.C. 154(b) by 616 days.

(21) Appl. No.: 13/046,487

(22) Filed: Mar. 11, 2011

(65) Prior Publication Data

US 2011/0268943 A1 Nov. 3, 2011

(30) Foreign Application Priority Data

Apr. 30, 2010 (TW) .............................. 099113912 A

(51) Int. Cl.
| | |
|---|---|
| *B05D 1/36* | (2006.01) |
| *H05H 1/24* | (2006.01) |
| *B32B 7/02* | (2006.01) |
| *B32B 9/00* | (2006.01) |
| *B32B 9/04* | (2006.01) |
| *C23C 16/32* | (2006.01) |
| *C23C 16/27* | (2006.01) |
| *C23C 30/00* | (2006.01) |
| *C23C 16/503* | (2006.01) |

(52) U.S. Cl.
CPC ............. *C23C 16/503* (2013.01); *C23C 16/325* (2013.01); *C23C 16/278* (2013.01); *C23C 16/27* (2013.01); *C23C 30/00* (2013.01)
USPC ........... 428/448; 428/216; 428/408; 427/402; 427/557; 427/558

(58) Field of Classification Search
USPC ........... 427/402, 577, 578; 428/216, 408, 448
See application file for complete search history.

(56) References Cited

U.S. PATENT DOCUMENTS

| | | | | |
|---|---|---|---|---|
| 5,494,742 | A | * | 2/1996 | Seki et al. ...................... 428/332 |
| 6,312,808 | B1 | | 11/2001 | Veerasamy et al. |
| 6,335,086 | B1 | * | 1/2002 | Veerasamy ................... 428/217 |
| 6,468,642 | B1 | | 10/2002 | Bray et al. |

(Continued)

FOREIGN PATENT DOCUMENTS

CN 1782123 6/2006

OTHER PUBLICATIONS

Lung et al., "Effect of gradient a-Si$C_x$ interlayer on adhesion of DLC films," Materials Chemistry and Physics, 2001, vol. 72, pp. 163-166.

(Continued)

*Primary Examiner* — Jonathan Langman
(74) *Attorney, Agent, or Firm* — Hamre, Schumann, Mueller & Larson, P.C.

(57) ABSTRACT

A substrate coating and a method of forming the same are provided. The substrate coating includes a first layer formed on a substrate, in which the composition of the first layer includes at least silicon-rich-carbon, and the amount of silicon is about equal to or greater than the amount of carbon; and a second layer formed on the first layer, in which the composition of the second layer includes at least fluorine doped diamond-like-carbon. The substrate coating not only is easy to clean, has good wearing performance, and provides a smooth surface, but also has better adhesion to prevent peeling off.

18 Claims, 1 Drawing Sheet

(56) References Cited

U.S. PATENT DOCUMENTS

| | | | |
|---|---|---|---|
| 6,730,591 B2 * | 5/2004 | Han et al. | 438/618 |
| 2002/0098285 A1 | 7/2002 | Hakovirta et al. | |
| 2003/0064225 A1 | 4/2003 | Ohashi et al. | |

OTHER PUBLICATIONS

Donnet, "Recent progress on the tribology of doped diamond-like and carbon alloy coatings: a review," Surface Coatings and Technology, 1998, vol. 100-101, pp. 180-186.

* cited by examiner

SUBSTRATE COATING AND METHOD OF FORMING THE SAME

FIELD OF THE INVENTION

The present invention relates to a coating, and more particularly to an easy-to-clean substrate coating.

DESCRIPTION OF THE PRIOR ART

Electronic products have become indispensable in modern life. Besides various newly developed functions, the appearance has also become an important consideration for consumers when choosing and buying an electronic product. The housing of a common electronic product can be a metal housing, a mirror surface, a piano baking varnish, and the like. No matter which kind of housing it is, once the housing is stained with fingerprints, the appearance is inevitably affected. Therefore, it is necessary to provide an easy-to-clean coating, so that fingerprints are not easily left on the housing or can be easily removed.

The main compositions of an easy-to-clean coating are hydrophobic and oleophobic high-molecular-weight organic compounds, and there are two conventional methods for forming an easy-to-clean coating; one is a sol-gel method, and the other is Chemical Vapor Deposition (CVD).

Since coating has a rather small thickness, the sol-gel method can only adopt the splashing or soaking process, and thus is not suitable for manufacturing process covering a large area (for example, 1 m$^2$). In addition, it easily causes tear stains at edges even in a manufacturing process covering a small area (for example, 0.1 m*0.1 m), The coating formed by CVD has poor adhesion, and is restricted in terms of the chemical compositions of the coating. For example, high-molecular organic compounds are easily decomposed during volatilization and thus are not suitable for the CVD. Moreover, the use of CVD also results poor uniformity in the distribution of the chemical compositions. Therefore, there is an urgent need for an easy-to-clean coating suitable for manufacturing process covering a large area, a variety of substrates, and numerous chemical compositions.

SUMMARY OF THE INVENTION

In an embodiment, the present invention provides a substrate coating, which includes: a first layer formed on a substrate, in which the composition of the first layer includes at least silicon-rich-carbon, and the amount of silicon is about equal to or greater than the amount of carbon; and a second layer formed on the first layer, in which the composition of the second layer includes at least fluorine doped diamond-like-carbon.

In another embodiment, the present invention provides a method of forming a coating, which includes: forming a first layer on a substrate, in which the composition of the first layer includes at least silicon-rich-carbon, and the amount of silicon is about equal to or greater than the amount of carbon; and forming a second layer on the first layer, in which the composition of the second layer includes at least fluorine doped diamond-like-carbon.

According to a preferred embodiment of the present invention, the first layer and the second layer are formed on the substrate by a Plasma Enhanced CVD (PECVD) process.

The fluorine doped diamond-like-carbon used in the present invention can achieve the easy-to-clean function, and provide a hard, scratch-resistant, and smooth surface. The silicon-rich-carbon can serve as a stress matched interface between the second layer and the substrate, and the ratio of silicon to carbon is adjusted according to the properties of the substrate, so as to enable the coating to have better adhesion to avoid peeling off. Moreover, the PECVD used in the present invention can generate a thin and light-transmissive coating having a uniform thickness.

In order to make the aforementioned and other objectives, features, and advantages of the present invention more comprehensible, preferred embodiments accompanied with figures are described in detail below.

DETAILED DESCRIPTION

Figure 1:
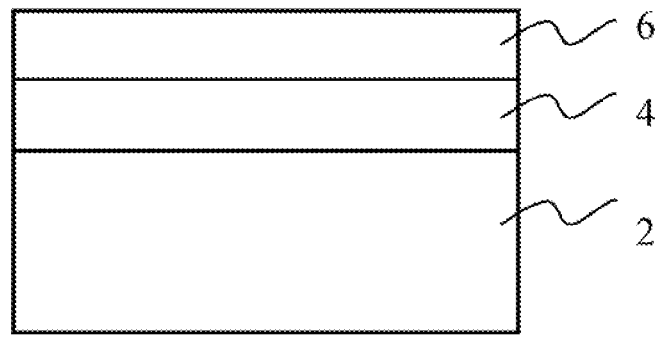
FIG. 1 shows a substrate coating according to a preferred embodiment of the present invention.

FIG. 1 shows a substrate coating according to a preferred embodiment of the present invention. A layer 4 on a substrate 2 includes at least silicon-rich-carbon, in which the amount of silicon is about equal to or greater than the amount of carbon. A layer 6 on the layer 4 includes at least fluorine doped diamond-like-carbon. The silicon-rich-carbon provides a stress matched interface between the substrate 2 and the layer 6, so that the layer 6 is not easily broken due to the stress. Depending upon different materials of the substrate 2, the ratio of silicon to carbon in the layer 4 must be adjusted so as to achieve stress matching.

In an embodiment of the present invention, the layer 4 and the layer 6 are sequentially formed on the substrate 2 by a PECVD process. As PECVD is prior art, the implementation is not described in detail herein. By using the PECVD in the present invention, the thickness of the coating can be controlled more accurately, and a desired smoothness can be achieved no matter whether the area is large area (for example, 1 m*1 m) or small (for example, 0.01 m*0.01 m). Since PECVD can generate a rather thin (may be smaller than 100 nm) coating with a uniform thickness, the coating of the present invention is light transmissive, and thus can be widely applied in various electrical products, for example, mobile phones and notebook computers. Moreover, by using PECVD, the ratio of silicon to carbon in the layer 4 and the ratio of fluorine to carbon in the layer 6 can be easily controlled. Furthermore, compared with the conventional CVD, in which it is difficult to dope fluorine into diamond-like-carbon, if PECVD is used, the decomposition of compounds can be easily controlled even in commercial applications.

In another embodiment of the present invention, in the process of depositing the silicon-rich-carbon and the fluorine doped diamond-like-carbon by the PECVD method, oxygen gas, nitrogen gas, argon gas, or helium gas is introduced and mixed with a reactant gas (for example, silicone-, carbon-, and/or fluorine-containing gas) before entering a reaction chamber, so as to control the compositions of the silicon-rich-carbon layer and the fluorine doped diamond-like-carbon layer more accurately. In a preferred embodiment, the operating pressure is maintained at about 0.1 Torr, and the deposition rate falls between about 1 nm/min and 500 nm/min.

In the process of depositing the fluorine doped diamond-like-carbon, a bias voltage of a PECVD device may be adjusted, so as to obtain a higher content of diamond-like-carbon, thereby achieving a better scratch resistant capability. Moreover, during the deposition, the fluorine content is adjusted, so as to obtain a higher content of fluorine-carbon, and a desired oleophobic and hydrophobic effect can be achieved through fine adjustment of the fluorine content.

In a preferred embodiment of the present invention, a material of the substrate may be glass, stainless steel, magnesium alloy, ceramic, aluminum, or aluminum alloy. The ratio of silicon to carbon in the layer 4 is about 1:1 to 20:1. When the material of the substrate is glass, the ratio of silicon to carbon in the layer 4 is about 3:1 to 15:1; when the material of the substrate is stainless steel, the ratio of silicon to carbon in the layer 4 is about 1:1 to 3:1; when the material of the substrate is magnesium alloy, the ratio of silicon to carbon in the layer 4 is about 2:1 to 10:1; when the material of the substrate is aluminum or aluminum alloy, the ratio of silicon to carbon in the layer 4 is about 3:1 to 15:1; and when the material of the substrate is ceramic, the ratio of silicon to carbon in the layer 4 is about 3:1 to 15:1.

A fluorinated long carbon chain can fulfill the easy-to-clean function, so the easy-to-clean function can be achieved by using the fluorine doped diamond-like-carbon in a preferred embodiment of the present invention. Moreover, fluorine makes the surface smooth, and the diamond-like-carbon provides a hard surface, so the surface of the coating is not easily scratched. According to an embodiment of the present invention, the ratio of fluorine to carbon in the layer 6 may be about 1:0.5 to 1:100, and is preferably about 1:10 to 1:80.

Figure 2:
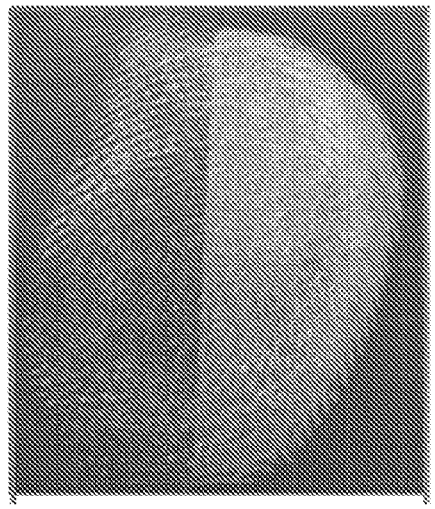
FIG. 2 shows a fingerprint left on the left side when a substrate coating of the present invention is used, and shows a fingerprint left on the right side when the substrate coating of the present invention is not used.
Figure 3:
FIG. 3 shows a condition of the substrate shown in FIG. 2 after being wiped.

FIG. 2 shows a fingerprint left on the left side when a substrate coating of the present invention is used, and a fingerprint left on the right side when the substrate coating of the present invention is not used. FIG. 3 shows a condition of the substrate shown in FIG. 2 after being wiped. As can be seen from FIGS. 2 and 3, the fingerprint is not easily left when the substrate coating of the present invention is used, and even if it is left, it can be completely removed by wiping. In contrast, in the control group where the substrate coating is not used, the fingerprint is easily left, and grease from hands still remains after wiping.

Table 1 further shows a plurality of tests that the substrate coating of the present invention has passed, and serves as corroborative evidence of the advantages of the present invention.

TABLE 1

| Test | Result |
| --- | --- |
| Cleaning Test (fingerprint removal test) | Removed after wiping once |
| Friction Test (in accordance with specifications in ISO2409 and DIN53151) | The coating did not peel off after being rubbed for 40,000 times. |
| Adhesion Test (cross cut, in accordance with specifications in ISO2409) | 0 cut |
| Heat Test (thermal shock, in accordance with specifications in IEC60068-2-14 + Cleaning Test) | Passed |
| Damp Heat Test (in accordance with specifications in IEC68-2-30 + Cleaning Test) | Passed |
| Scratch Test (in accordance with specifications in ISO1518) | The first visible scratch was observed after the coating was scratched for 10-12 times. |

In view of the above, the fluorine doped diamond-like-carbon used in the present invention can achieve the easy-to-clean function, and provide a hard, wear-resistant, scratch-resistant, and smooth surface. The silicon-rich-carbon can adjust stress matching between the second layer and a variety of substrates, so as to enable the coating to have better adhesion to avoid peeling off. Moreover, the PECVD used in the present invention can generate a quite thin (smaller than 100 nm) and light-transmissive coating having a uniform thickness. Furthermore, by using PECVD, the decomposition of compounds can be controlled easily. Therefore, the present invention provides not only a good substrate coating, but also a method of forming a coating that is suitable for commercial applications.

Although the technical contents and features of the present invention are described above, various variations and modifications can be made by persons of ordinary skill in the art without departing from the teaching and disclosure of the present invention. Therefore, the scope of the present invention is not limited to the disclosed embodiments, but encompasses other variations and modifications that do not depart from the present invention as defined by the appended claims.

We claim:

1. A surface coating for a housing of an electronic product, comprising:
   a first layer, formed on a substrate, wherein a composition of the first layer comprises at least silicon-rich-carbon, wherein a ratio of silicon to carbon in the first layer falls between 2:1 and 20:1; and
   a second layer, formed on the first layer, wherein a composition of the second layer comprises at least fluorine doped diamond-like-carbon.

2. The surface coating according to claim 1, wherein a ratio of silicon to carbon in the first layer falls between 3:1 and 20:1.

3. The surface coating according to claim 1, wherein the first layer serves as a stress matched interface between the second layer and the substrate.

4. The surface coating according to claim 1, wherein a ratio of fluorine to carbon in the fluorine doped diamond-like-carbon substantially falls within a range of 1:0.5 to 1:100.

5. The surface coating according to claim 1, wherein a ratio of fluorine to carbon in the fluorine doped diamond-like-carbon substantially falls within a range of 1:10 to 1:80.

6. The surface coating according to claim 1, wherein the first layer and the second layer are formed on the substrate by a Plasma Enhanced Chemical Vapor Deposition (PECVD) process.

7. The surface coating according to claim 1, wherein a thickness of the first layer and a thickness of the second layer are smaller than 100 nm respectively.

8. The surface coating according to claim 1, wherein the substrate is formed by glass, stainless steel, magnesium alloy, ceramic, aluminum, or aluminum alloy.

9. A method of forming a coating on a surface of a housing of an electronic product, comprising:
   forming a first layer on a substrate, wherein a composition of the first layer comprises at least silicon-rich-carbon, wherein a ratio of silicon to carbon in the first layer falls between 2:1 and 20:1; and
   forming a second layer on the first layer, wherein a composition of the second layer comprises at least fluorine doped diamond-like-carbon.

10. The method according to claim 9, wherein a ratio of silicon to carbon in the first layer falls between 3:1 and 20:1.

11. The method according to claim 9, wherein the first layer serves as a stress matched interface between the second layer and the substrate.

12. The method according to claim 9, wherein a ratio of fluorine to carbon in the fluorine doped diamond-like-carbon substantially falls within a range of 1:0.5 to 1:100.

13. The method according to claim 9, wherein a ratio of fluorine to carbon in the fluorine doped diamond-like-carbon substantially falls within a range of 1:10 to 1:80.

14. The method according to claim 9, wherein the first layer and the second layer are formed by a Plasma Enhanced Chemical Vapor Deposition (PECVD) process.

15. The method according to claim 9, wherein the substrate is formed by glass, stainless steel, magnesium alloy, ceramic, aluminum, or aluminum alloy.

16. The method according to claim 14, wherein an operating pressure is 0.1 Torr, and a deposition rate is 1 nm/min to 500 nm/min.

17. The method according to claim 14, further comprising: adjusting a bias voltage of a PECVD device.

18. The method according to claim 14, further comprising: introducing oxygen gas, nitrogen gas, argon gas, or helium gas for mixing with a reactant gas.

* * * * *